United States Patent [19]

Sanada et al.

[11] Patent Number: 4,497,677
[45] Date of Patent: Feb. 5, 1985

[54] METHOD FOR MANUFACTURING CERAMIC SUBSTRATE

[75] Inventors: Sakae Sanada, Hadano; Yoshiyuki Ohzawa, Hiratsuka, both of Japan

[73] Assignee: Hitachi, Ltd., Tokyo, Japan

[21] Appl. No.: 463,855

[22] Filed: Feb. 4, 1983

[30] Foreign Application Priority Data

Mar. 10, 1982 [JP] Japan .................................. 57-37367

[51] Int. Cl.³ ........................ B32B 31/14; C04B 39/12
[52] U.S. Cl. ........................................ 156/89; 264/56; 264/58; 264/65; 264/66; 264/67
[58] Field of Search ...................... 156/89; 264/58, 63, 264/64, 65, 66, 56, 67

[56] References Cited

U.S. PATENT DOCUMENTS

| | | | |
|---|---|---|---|
| 3,505,139 | 4/1970 | Wentworth | 156/89 |
| 3,770,529 | 11/1973 | Anderson | 156/89 |
| 4,009,238 | 2/1977 | Niedermeier et al. | 264/63 |
| 4,159,295 | 6/1979 | Mazzuchelli et al. | 264/66 |

Primary Examiner—Caleb Weston
Attorney, Agent, or Firm—Antonelli, Terry & Wands

[57] ABSTRACT

A method for manufacturing a ceramic substrate, featured by pressing of the green sheet to reduce its dimensional change with time is provided. After this dimensional stabilization treatment, a conductor is printed on the surface of the green sheet and then the conductor-printed green sheet is sintered.

10 Claims, 3 Drawing Figures

THIS INVENTION

METHOD FOR MANUFACTURING CERAMIC SUBSTRATE

BACKGROUND OF THE INVENTION

1. Field of the Invention

This invention relates to a method for manufacturing ceramic substrates. More specifically, it relates to a method for producing ceramic substrates designed for mounting thereon semiconductor or integrated circuit chips.

2. Description of the Prior Art

FIG. 1 shows a flow chart of the conventional ceramic substrate manufacturing process. Manufacturing of a ceramic substrate starts with the preparation of a so-called green sheet. This green sheet is made by first forming a slip from a mixture of alumina powders with organic solvents, passing the slip through a blade with a predetermined gap, casting it into a sheet form and drying the formed sheet. This green sheet is then punched to form the guide holes which serve as a reference position in the succeeding steps. Through-holes are also punched out in the green sheet. These holes may be formed by drilling. On the surface of said green sheet is then formed a paste-like conductor by a usual means such as screen printing. The through-holes are filled up with the conductor in this operation. For forming a multi-layer ceramic substrate, a desired number of such green sheets are placed one upon another and press bonded under suitable heating and pressure, and the resulting laminate sheet is cut to a desired size and sintered at a temperature of one thousand and several hundred degrees centigrade.

According to the prior art, punching of the green sheet for forming the guide holes has been conducted after approximately one week standing of the green sheet after its preparation. This was necessary for aging the sheet till the rate of its dimensional change diminishes to an insignificant level since the green sheet is subject to dimensional change which begins soon after its formation and continues for a certain period. As seen from FIG. 2 showing the curves of dimensional change of a conventional green sheet, the amount of dimensional change of the green sheet diminishes with the lapse of time (days). It will be also seen that the amount of dimensional change differs greatly between X direction and Y direction in relation to the casting direction.

However, as noted from FIG. 2, the amount of dimensional change of the green sheet is fairly large even after approximately one week standing. This is prone to cause positional deviations in the ensuring steps, making it difficult to obtain a ceramic substrate of high precision. Several measures have been proposed and employed for overcoming this problem, such as extending the standing period of the green sheet; reducing the time used for the process from guide hole punching till lamination; and diminishing the size of the green sheet to reduce a number of substrates cut out from said green sheet.

SUMMARY OF THE INVENTION

An object of this invention is to provide a method for manufacturing a ceramic substrate of high precision.

Another object of this invention is to provide a ceramic substrate manufacturing method according to which the dimensional change of the green sheet with time is minimized.

Still another object of this invention is to provide a high-precision multi-layer ceramic substrate.

According to this invention, it was disclosed that the dimensional change of the green sheet with time can be greatly reduced by subjecting the green sheet to a press work. Thus, based upon this concept, this invention comprises essentially steps of preparing green sheets, pressing the green sheets, forming a conductor on the surface of the pressed green sheets and sintering the thus treated green sheets.

When producing a multi-layer ceramic substrate, each of the pressed green sheets is punched for forming the through-holes and a conductor is formed both on the surface of each green sheet and in said through-holes, and a desired number of such green sheets formed with said conductor are laminated and sintered.

DESCRIPTION OF THE PREFERRED EMBODIMENTS

Figure 1:
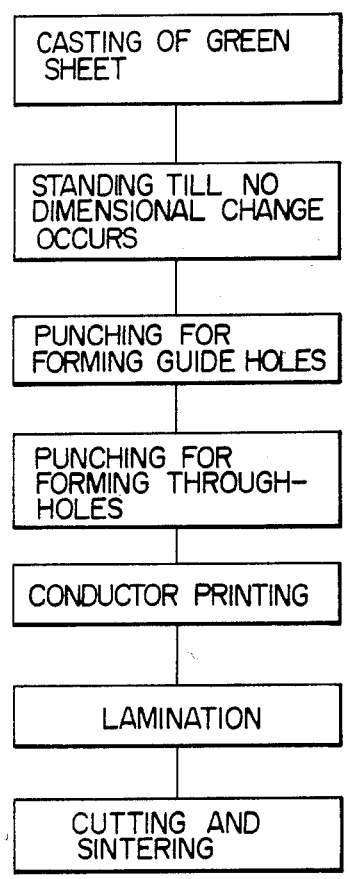
FIG. 1 is a flow chart showing a conventional ceramic substrate manufacturing process.
Figure 3:
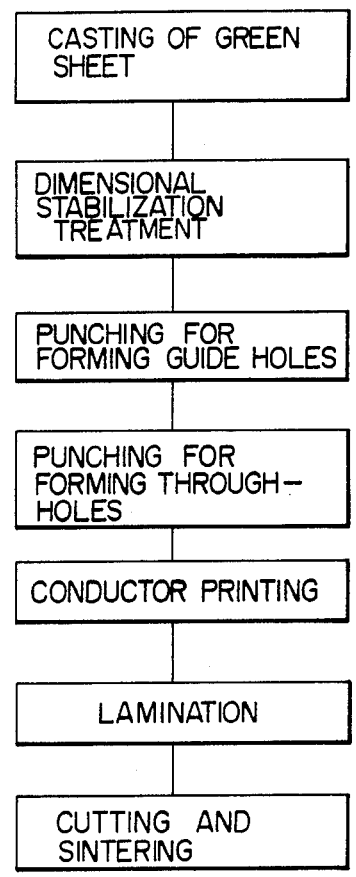
FIG. 3 is a flow chart of an embodiment of the ceramic substrate manufacturing process according to this invention.

Referring to FIG. 3, there is shown a process for manufacturing a multi-layer ceramic substrate. The first step of the process is the preparation of green sheets. The green sheet preparation method is the same as in the prior art. According to this invention, each prepared green sheet is subjected to a dimensional stabilization treatment. This treatment comprises pressing of the green sheet. This dimensional stabilization treatment is followed by the guide hole punching and other steps which are the same as those of the conventional process shown in FIG. 1.

In the case of producing a single-layer ceramic substrate, the step of punching the green sheet for forming through-holes and the step of lamination are unnecessary. However, when mounting the integrated circuit chips on one side of the sheet while providing the pins for external connections on the other side, the through-hole punching step needs to be included in the process as it is necessary to form the through-holes for connecting one side to the other.

Figure 2:
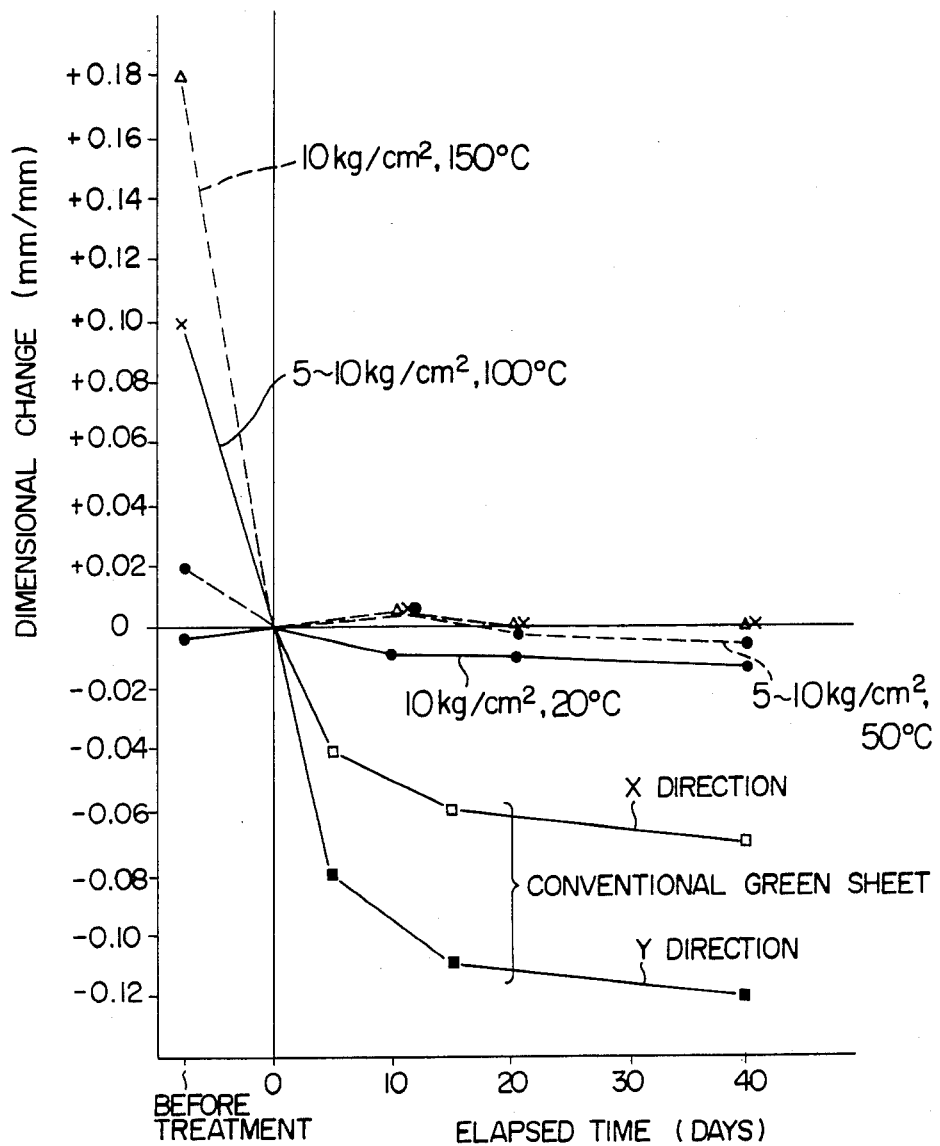
FIG. 2 is a graph showing comparatively the dimensional changes with time of the green sheets worked according to this invention and of a conventional green sheet.

The dimensional changes with time of the green sheets which have been prepared from the same composition and under the same working conditions as in the prior art process but which have been subjected to the dimensional stabilization treatment according to this invention are shown in FIG. 2 in contrast with the dimensional chages of the conventional green sheet which has not been subjected to said dimensional stabilization treatment. The temperature and pressure used for the pressing operation are as shown in the same figure. The pressing time was 5 minutes. This pressing time generally includes surplus time in addition to the time required for heating the green sheet to a desired temperature.

It will be seen from FIG. 2 that the dimensional change of the green sheet with time is markedly reduced when the green sheet is subjected to the dimensional stabilization treatment according to this invention, and there is substantially no difference in such reduction of dimensional change between X direction and Y direction. Such effect can be ascribed to the removal of residual stress and remaining solvents in the green sheet as well as uniform compaction of the mixture (green sheet composition) by pressing.

Only a part of the experimental results is plotted in the graph of FIG. 2. According to the experiments and studies by the present inventors, the pressing conditions for obtaining a desired effect of dimensional stabilization were as follows: temperature in the range of 20° to 250° C., preferably 70° to 150° C., and pressure in the range of 1 to 100 kg/cm$^2$, preferably 3 to 20 kg/cm$^2$.

These pressing conditions will be discussed more fully below. If the temperature used for the pressing operation is lower than 20° C. (ordinary temperature), the mixture constituting the green sheet has little mobility and the solvents which are the volatile components are scarcely volatilized, resulting in insufficient removal of residual stress and insufficient homogenization of the mixture, so that no satisfactory effect of dimensional stabilization of the green sheet is provided. To the contrary, if the pressing temperature is higher than 250° C., the plasticizer in the green sheet is volatilized to excess, resulting in hardening of the sheet, so that the green sheet becomes fragile after the treatment to hinder the guide hole and/or through-hole punching operation in the ensuring step. These facts have led to the conclusion that usually the lower limit of the temperature range allowable for the pressing operation is 20° C. while the upper limit is 250° C.

In such temperature range, as mentioned above, the preferred range from the aspects of the effect on dimensional stabilization and the green sheet workability in the ensuring steps is between 70° and 150° C. Use of a temperature above 70° C. allows sufficient softening of the organic binder in the green sheet and makes the green sheet composition well mobile, with the result that the composition is sufficiently homogenized and packed more density and also removal of residual stress and volatilization of remaining solvents can be accomplished satisfactorily by pressing, thus providing a desired effect of dimensional stabilization. If the temperature exceeds 150° C., however, there may take place hardening of the organic binder or volatilization of the plasticizer to cause weakening of the green sheet.

If a pressure of not less than 1 kg/cm$^2$ to be applied in the pressing operation, although it has certain temperature dependency, the homogenization and compaction of the mixture and the removal of residual stress are effected to the same extent and, therefore, a desired effect of dimensional stabilization is provided. However, for obtaining a well satisfactory effect, it is recommended to apply a pressure of 3 kg/cm$^2$ higher.

The upper limit of pressure applicable is decided with relation to the laminating and sintering steps rather than to dimensional stabilization. The pressure and temperature used for hot pressing in the lamination process should be higher than those used for the dimensional stabilization treatment because otherwise the printed conductor layer may not be embedded in a desired way to cause the creation of interlaminar voids or interlaminar separation. Also, elimination of a binder and a plasticizer during sintering will be discouraged to reduce the strength of sintered ceramics because the higher the pressure applied for the dimensional stabilization treatment, the more density packed is the sheet mixture. For these reasons, the upper limit of pressure applicable for hot pressing in said dimensional stabilization treatment is usually set at 100 kg/cm$^2$, preferably 20 kg/cm$^2$.

Thus, the permissible range of pressure for the hot pressing operation in this invention is from 1 to 100 kg/cm$^2$, preferably 3 to 20 kg/cm$^2$.

As described above, this invention can markedly reduce the dimensional change of the green sheet with time and thus makes it possible to easily produce a high-precision ceramic substrate from a process such as shown in FIG. 3. Thus, according to this invention, instead of allowing the green sheet to stand for a long time after its casting, it is immediately subjected to a dimensional stabilization treatment and this is followed by other necessary steps. The steps from guide hole punching to lamination need not be conducted for such a short time as in the prior art.

As explained above, the pressure applied in hot pressing for the lamination should be at least higher than that applied in the dimensional stabilization treatment. The temperature may be equal to or higher than that used for the dimensional stabilization treatment.

In the process shown in FIG. 3, guide holes are formed in the green sheet to let them serve for positioning in the succeeding steps, but instead of forming such guide holes, the green sheet may be pasted to a frame to thereby allow positioning, and in this case, too, the similar effect can be obtained by incorporating the step for the dimensional stabilization treatment of this invention in the same way as mentioned above.

What is claimed is:

1. A method for manufacturing a ceramic substrate comprising the steps of:
    making a green sheet;
    pressing and heating said green sheet to a temperature of 20° to 250° C., the pressure applied during the pressing being within the range of 1 to 100 kg/cm$^2$ to effect dimensional stabilization of said green sheet;
    forming a conductor on the surface of said green sheet; and
    sintering the conductor-formed green sheet.

2. The method of claim 1, wherein the pressure applied for the pressing of the green sheet is within the range of 3 to 20 kg/cm$^2$.

3. The method of claim 2, wherein pressing of the green sheet is effected while heating the green sheet to a temperature of 70° to 150° C.

4. The method of claim 1, wherein pressing of the green sheet is effected while heating the green sheet to a temperature of 70° to 150° C.

5. A method for manufacturing a ceramic substrate comprising the steps:
    making green sheets;
    pressing and heating each of said green sheets to a temperature of 20° to 250° C., the pressure applied during the pressing being within the range of 1 to 100 kg/cm$^2$ to effect dimensional stabilization of said green sheets;
    punching each of said green sheets for forming through-holes therein;
    forming a conductor on the surface and in said holes of each of said green sheets;
    laminating and bonding together a plurality of said green sheets formed with said conductor under heat and pressure; and
    sintering the laminated green sheets.

6. The method of claim 5, wherein pressing of the green sheet is effected while heating the green sheet to a temperature of 70° to 150° C.

7. The method of claim 5, wherein the pressure applied for the pressing of each of said green sheets is within the range of 3 to 20 kg/cm².

8. The method of claim 7, wherein pressing of the green sheet is effected while heating the green sheet to a temperature of 70° to 150° C.

9. The method of claim 5, wherein the pressure and the heating temperature employed during said laminating step are equal to or higher than those used for the pressing and heating of each of said green sheets.

10. The method of claim 5, wherein the green sheets are made from a mixture of alumina powders and volatile organic components.

* * * * *